(12) United States Patent
Cox et al.

(10) Patent No.: US 9,603,273 B2
(45) Date of Patent: *Mar. 21, 2017

(54) UNIVERSAL SYSTEM FOR MOUNTING RACK DOORS

(71) Applicant: INTERNATIONAL BUSINESS MACHINES CORPORATION, Armonk, NY (US)

(72) Inventors: Aaron R. Cox, Tucson, AZ (US); Jason E. Minyard, Phoenix, AZ (US); Camillo Sassano, Durham, NC (US); Joni E. Saylor, Phoenix, AZ (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 15/076,792

(22) Filed: Mar. 22, 2016

(65) Prior Publication Data

US 2016/0201370 A1 Jul. 14, 2016

Related U.S. Application Data

(63) Continuation of application No. 14/853,689, filed on Sep. 14, 2015, now Pat. No. 9,301,413, which is a (Continued)

(51) Int. Cl.
*E05D 7/06* (2006.01)
*H05K 5/02* (2006.01)
(Continued)

(52) U.S. Cl.
CPC .......... *H05K 5/0239* (2013.01); *E05C 21/00* (2013.01); *E05D 3/02* (2013.01); *E05D 7/04* (2013.01);
(Continued)

(58) Field of Classification Search
CPC ....... E05D 7/04; E05D 7/0415; E05D 7/0423; E05D 7/081; E05D 7/082; E05D 7/10;
(Continued)

(56) References Cited

U.S. PATENT DOCUMENTS

| 197,126 A | 11/1877 | Hasbrouck |
| 1,057,972 A | 4/1913 | McFarland |

(Continued)

FOREIGN PATENT DOCUMENTS

| DE | 3623218 A1 | 1/1988 |
| DE | 3905583 A1 | 10/1989 |

(Continued)

*Primary Examiner* — Chuck Mah
(74) *Attorney, Agent, or Firm* — Griffiths & Seaton PLLC

(57) ABSTRACT

A mount for mounting a door to rack includes a rack including a first pair of vertically-extending supports, each support including an array of openings; a first mount coupled to the rack at a first position thereon, the first mount including: a first plate extending between the first pair of vertically-extending supports and including a first end and a second end, and a first hinge arm adjustably coupled with the first plate; a second mount coupled to the rack at a second position located below the first position, the second mount including: a second plate extending between the first pair of vertically-extending supports and including a first end and a second end, and a second hinge arm adjustably coupled with the second plate.

7 Claims, 10 Drawing Sheets

Related U.S. Application Data continuation of application No. 13/909,393, filed on Jun. 4, 2013, now Pat. No. 9,163,442.

(51) Int. Cl.

| | |
|---|---|
| *E05C 21/00* | (2006.01) |
| *E05D 7/12* | (2006.01) |
| *H05K 7/14* | (2006.01) |
| *E05D 3/02* | (2006.01) |
| *E05D 7/04* | (2006.01) |
| *H05K 7/20* | (2006.01) |
| *E05D 5/02* | (2006.01) |

(52) U.S. Cl.
CPC .............. *E05D 7/12* (2013.01); *E05D 7/123* (2013.01); *H05K 5/0226* (2013.01); *H05K 7/1488* (2013.01); *H05K 7/20709* (2013.01); *E05D 5/023* (2013.01); *E05D 2007/0484* (2013.01); *E05Y 2900/606* (2013.01); *Y10T 16/304* (2015.01); *Y10T 29/49826* (2015.01)

(58) Field of Classification Search
CPC ....... E05D 7/00; E05D 7/0009; E05D 7/0018; E05D 7/12; E05D 7/123; E05D 2007/128; C05D 2007/0484; C05D 2007/0045; E05Y 2900/20; G06F 1/181; G06F 1/183; A47B 81/00; A47B 81/007; A47B 81/06; B65D 88/005; B65D 88/52; B65D 88/522; B65D 88/526
USPC ......... 16/229–231, 235, 236, 239, 249, 268, 16/382, 387, 389, 86.1, 86.2; 312/404, 312/405, 293.1, 293.2, 293.3, 324, 325, 312/326; 211/115, 116, 163, 165, 168, 211/144, 150; 49/240, 380, 381, 383, 49/504, 505
See application file for complete search history.

(56) References Cited

U.S. PATENT DOCUMENTS

| | | |
|---|---|---|
| 1,091,233 A | 3/1914 | Mitchell |
| 1,123,913 A | 1/1915 | Mueller |
| 1,490,956 A | 4/1924 | Binder |
| 1,564,668 A | 12/1925 | Hageman |
| 2,261,146 A | 10/1938 | Dow |
| 2,748,420 A | 6/1952 | Clover |
| 3,199,464 A | 8/1965 | Shook |
| 3,206,794 A | 9/1965 | Johnson, Jr. |
| 3,646,635 A | 3/1972 | Stermac |
| 4,407,044 A | 10/1983 | Iseki |
| 4,999,876 A | 3/1991 | Nass |
| 5,039,828 A | 8/1991 | Marks et al. |
| 5,078,461 A | 1/1992 | Beck et al. |
| 5,283,929 A | 2/1994 | Lin |
| 5,395,165 A | 3/1995 | Woerner |
| 5,561,886 A | 10/1996 | Flamme |
| 5,590,441 A | 1/1997 | Spencer |
| 5,956,809 A | 9/1999 | Hodgson |
| 6,021,909 A | 2/2000 | Tang et al. |
| 6,073,396 A | 6/2000 | Kietzmann |
| 6,286,692 B1 | 9/2001 | Hemping |
| 6,715,180 B2 | 4/2004 | Mueller et al. |
| 6,757,167 B2 | 6/2004 | Page et al. |
| 6,757,939 B2 | 7/2004 | Mueller et al. |
| 6,974,037 B2 | 12/2005 | Haney |
| 6,994,410 B2 | 2/2006 | Hogan |
| 7,090,318 B2 | 8/2006 | Brown |
| 7,293,666 B2 | 11/2007 | Mattlin et al. |
| 7,500,655 B1 | 3/2009 | Smith et al. |
| 7,667,135 B2 | 2/2010 | Adducci |
| 7,839,635 B2 | 11/2010 | Donowho et al. |
| 7,849,564 B2 | 12/2010 | Miller |
| 8,375,517 B1 | 2/2013 | Johnsen |
| 2003/0034717 A1 | 2/2003 | Yao |
| 2004/0189161 A1 | 9/2004 | Davis et al. |
| 2005/0183238 A1 | 8/2005 | McCue et al. |
| 2005/0259383 A1 | 11/2005 | Ewing et al. |
| 2006/0244351 A1 | 11/2006 | Moon et al. |
| 2006/0260207 A1 | 11/2006 | Chang |
| 2007/0221393 A1 | 9/2007 | Adducci et al. |
| 2008/0244983 A1 | 10/2008 | Peterson |
| 2010/0110621 A1 | 5/2010 | Dunn et al. |
| 2010/0263403 A1 | 10/2010 | Choi |
| 2013/0283567 A1 | 10/2013 | Yamaguchi |
| 2014/0317902 A1 | 10/2014 | Helbig et al. |

FOREIGN PATENT DOCUMENTS

| | | |
|---|---|---|
| FR | 2466591 A1 | 4/1981 |
| FR | 2685380 A1 | 6/1993 |
| FR | 2845722 A1 | 4/2004 |
| FR | 2999896 A1 | 6/2014 |
| GB | 2174752 A | 11/1986 |
| GB | 2278881 A | 12/1994 |
| JP | 2002129822 A | 5/2002 |

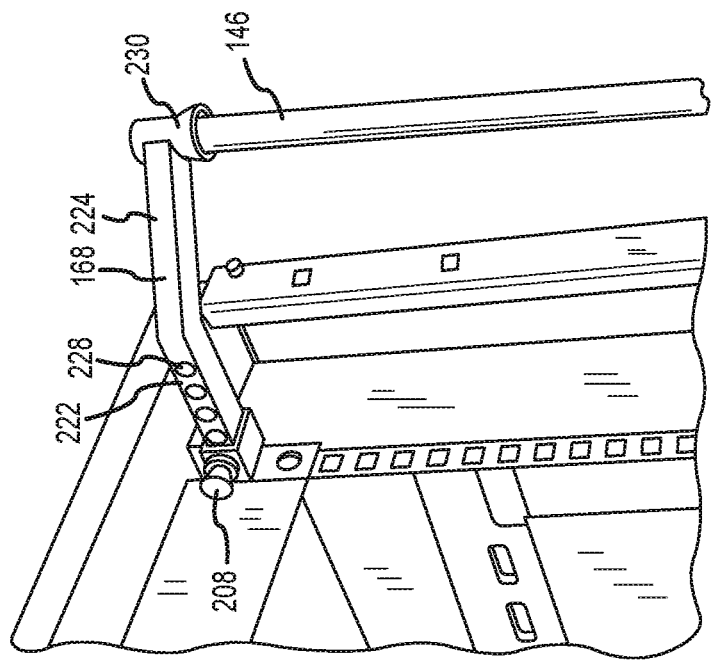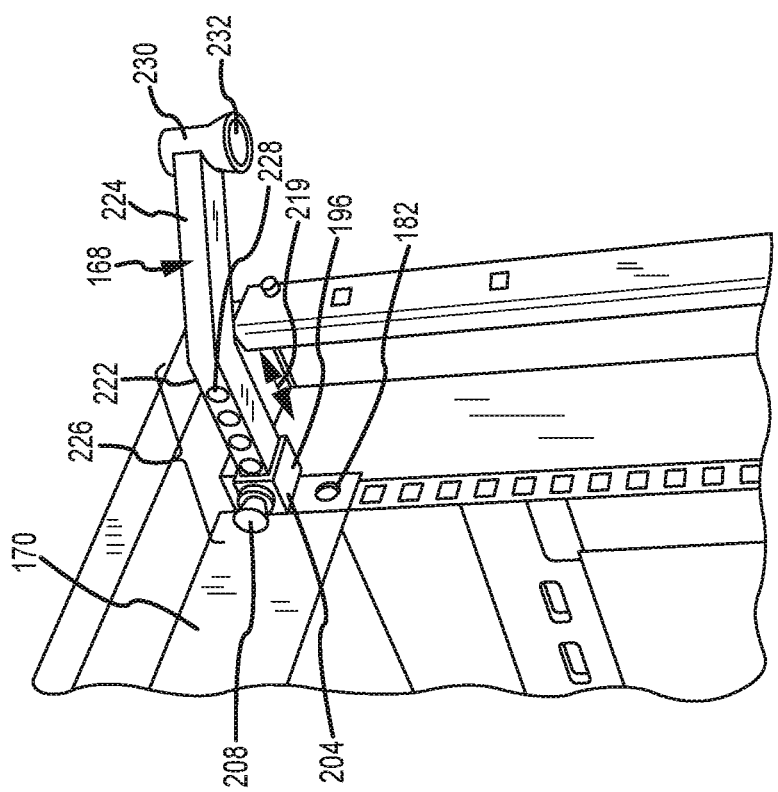

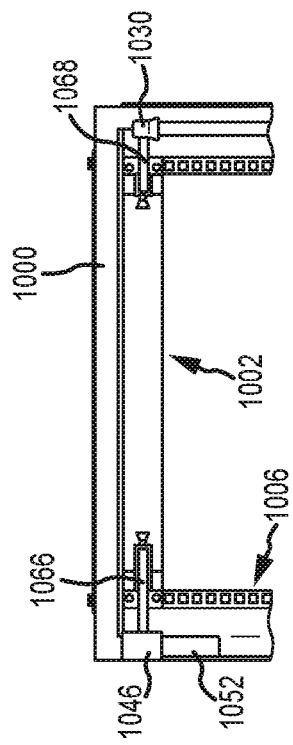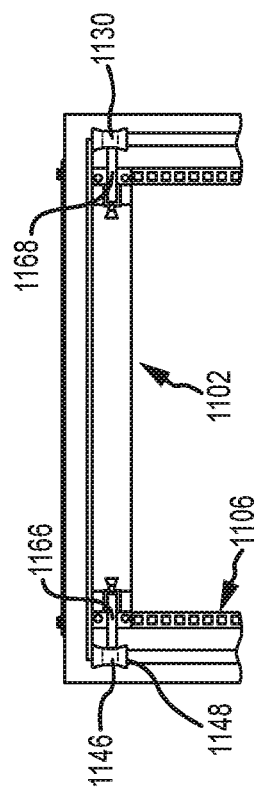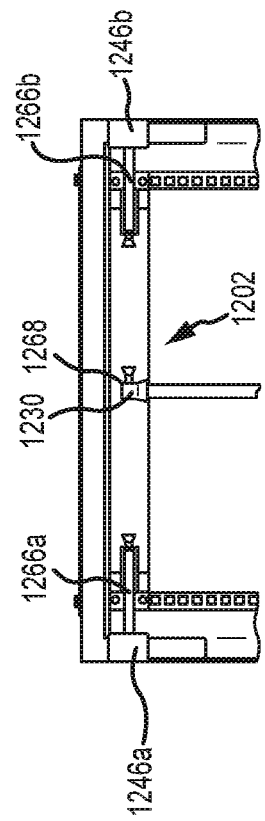

UNIVERSAL SYSTEM FOR MOUNTING RACK DOORS

CROSS-REFERENCE TO RELATED APPLICATIONS

This Application is a Continuation Application of U.S. patent application Ser. No. 14/853,689, filed on Sep. 14, 2015, which is a Continuation of U.S. Pat. No. 9,163,442 filed on Jun. 4, 2013, and the contents of each are incorporated herein by reference.

BACKGROUND OF THE INVENTION

Field of the Invention

The present invention relates in general to racks for mounting computer components, and in particular, to a universal system for mounting one or more doors to the racks.

Description of the Related Art

Servers are typically made up of electronic components that include processors and their associated electronics (e.g., memory, disk drives, power supplies, etc.) packaged in removable node configurations. To prevent damage during delivery from a manufacturer to a customer, the electronic components are stacked and/or mounted within an electronics (or IT) rack or frame, either in drawers in the rack or frame or at fixed locations thereon. After delivery in some instances, a customer may prefer to remove the electronic components from the manufacturer-provided rack and to mount the components onto already existing IT racks at the customer site.

SUMMARY OF THE INVENTION

During operation, some combinations of electronic components and IT racks can exhibit unwanted side effects, such as generating excessive noise or heat, and/or failing to contain an electromagnetic interference (EMI). Hence, a manufacturer may provide a cabinet for the rack, which may include a specially-designed door to reduce potential noise, heat, and/or EMI, and/or may include a system level status indicator. Typically, however, after the components are removed from the rack, the cabinet and rack are discarded.

Because IT racks are available through many different equipment providers and can have a variety of different configurations (for example, some IT racks are disposed in cabinets and positioned at various depths therein, and other IT racks have varying heights or include additional features that change one or more overall dimensions of the rack), simply transferring the manufacturer-provided doors to another cabinet or to another rack has not been possible in the past. To provide an option to the customer to recover at least some of the manufacturer-designed features of the cabinet, a universal door mounting system is now being provided. The mounting system allows the doors of the cabinet to be coupled to any IT rack.

In an embodiment, by way of example only, a door mounting system includes a rack, a first mount and a second mount. The rack includes a first pair of vertically-extending supports, each support including an array of openings. The first mount is coupled to the rack at a first position thereon and has a first plate and a first hinge arm. The first plate extends between the first pair of vertically-extending supports and including a first end and a second end, each of the first end and the second end including fastener openings aligned with corresponding openings of the array of openings of a corresponding support of the first pair of vertically-extending supports. The first hinge arm is adjustably coupled with the first plate and extends at an angle from a first side of the plate adjacent to the first end, the first hinge arm including a first door pin receptacle to receive a first door pin there through for coupling the door to the rack via the first plate. The second mount is coupled to the rack at a second position located below the first position and includes a second plate and a second hinge arm. The second plate extends between the first pair of vertically-extending supports and includes a first end and a second end, each of the first end and the second end including fastener openings aligned with corresponding openings of the array of openings of a corresponding support of the first pair of vertically-extending supports. The second hinge arm is adjustably coupled with the second plate and extends at an angle from the first side of the second plate adjacent to the first end thereof, the second hinge arm including a second door pin receptacle to receive a second door pin therethrough for coupling the door to the rack via the second plate. The first plate includes a hinge arm support member disposed over the first side of the first plate, the hinge arm support member includes a top opening to receive an end of the first hinge arm opposite the door pin receptacle, a spring loaded pin extends through a wall of the hinge arm support member, and the end of first hinge arm includes an array of apertures each configured to receive an end of the spring loaded pin to maintain the first hinge arm at a desired depth within the hinge arm support member selected from a plurality of depths for the end of the first hinge arm.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which:

FIG. 7 is a close-up view of a latch arm of the door mounting system mounted in the cabinet depicted in FIG. 1;

FIG. 8 is a close-up view of a latch arm mounted in the cabinet as depicted in FIG. 7 including a latching rod component;

FIG. 10 is a front view of an asymmetric configuration of the door mounting system attached to a rack;

FIG. 11 is a front view of a symmetric configuration of the door mounting system attached to a rack;

FIG. 12 is a front view of a split door configuration of the door mounting system attached to a rack.

DETAILED DESCRIPTION OF THE DRAWINGS

The illustrated embodiments below provide a door mounting solution that easily attaches to an electronic component rack, despite configuration variations of such racks between manufacturers. The mounting solution includes a plate configured to extend at least the Electronic Industry Association (EIA) standard distance between vertical supports making up a rack. Standard EIA mounting holes in the vertical supports are used for coupling the plate to the rack. To mount the door to the plate, a hinge arm extends from a front face of the plate at an angle away from a center of the plate. A depth of the hinge arm relative to the rack is adjustable to custom fit the door onto the rack. A latch arm extends from the front face of the plate either from an end of the plate that is opposite from the end including the hinge arm or substantially at the center of the plate. Similar to the hinge arm, the depth of the latch arm is adjustable relative to the plate. The door mounting system can include a top mount and a bottom mount. One or both of the top and/or bottom mounts includes a telescoping mechanism extending rearwardly and attaching to a rear vertical support to provide additional structure for attaching the door to the rack.

Figure 1:
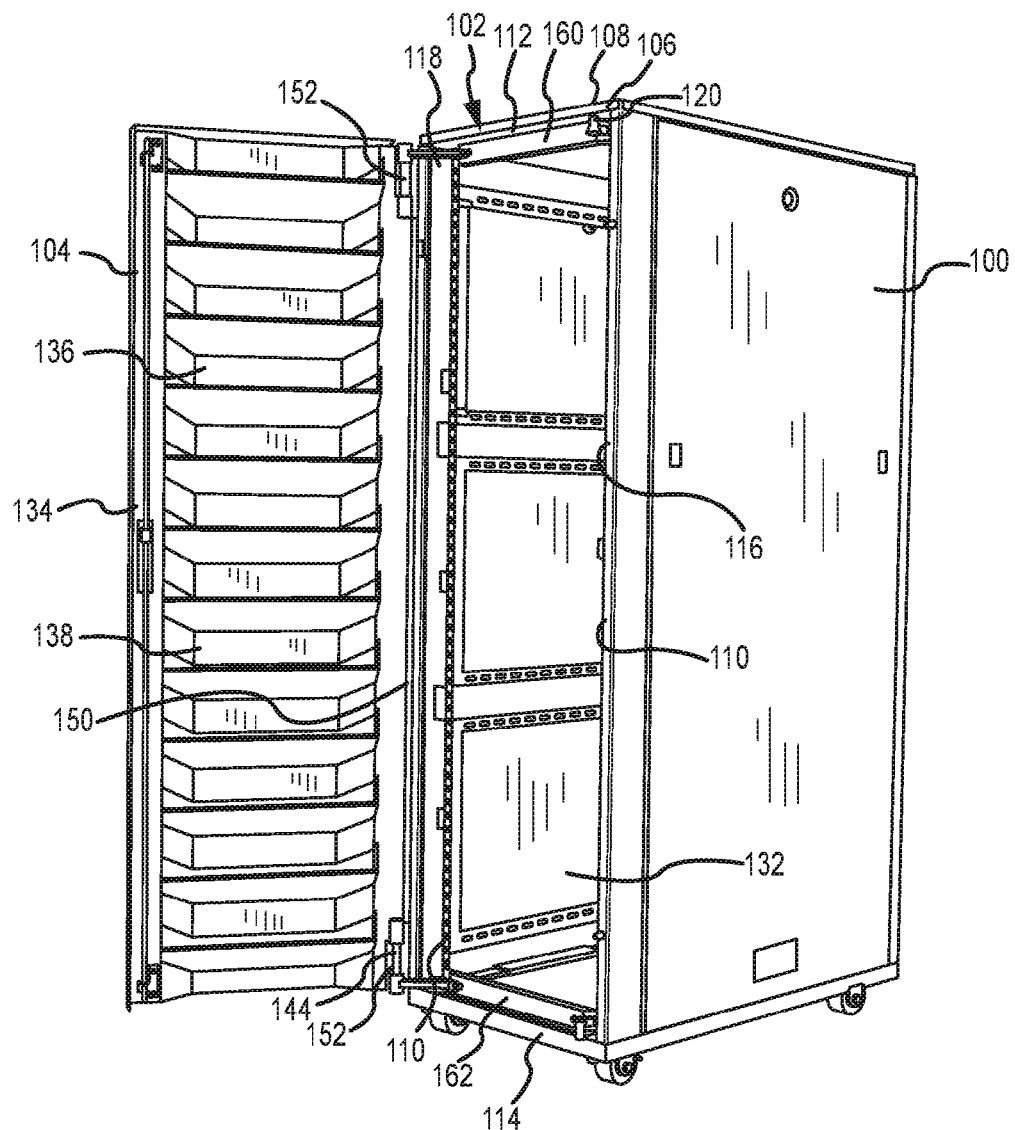
FIG. 1 is a front, perspective view illustration of a cabinet including a door mounting system mounting a door to a rack.

FIG. 1 is a front, perspective view illustration of a cabinet 100 including a door mounting system 102 mounting a door 104 to a rack 106, according to an embodiment. The cabinet 100 is configured to contain one or more computing components (not shown), such as a server or other hardware component typically employed for the operation of a computer system. The cabinet 100 has a cabinet frame 108 configured to surround the rack 106 and includes outer vertical posts 110, a top wall 112, a bottom platform 114, and side walls 116.

Figure 2:
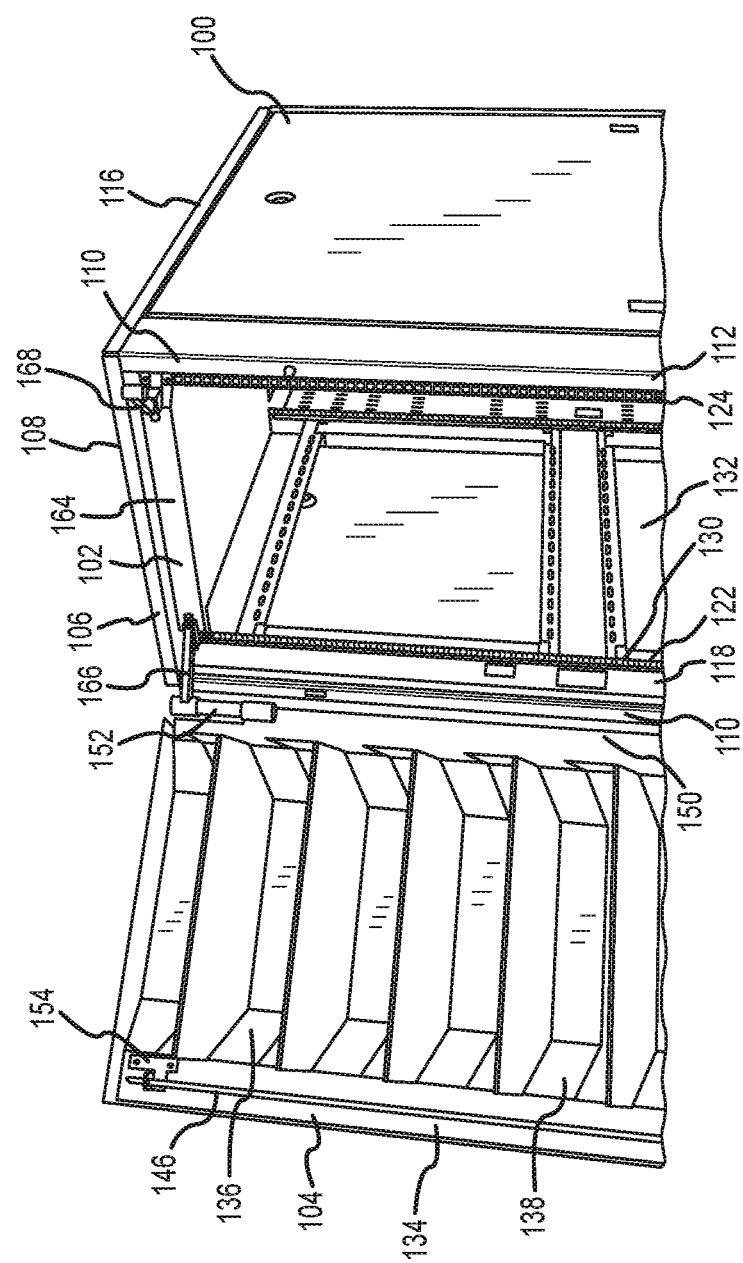
FIG. 2 is a close-up view of a portion of the cabinet and the door mounting system mounting the door depicted in FIG. 1.
Figure 3:
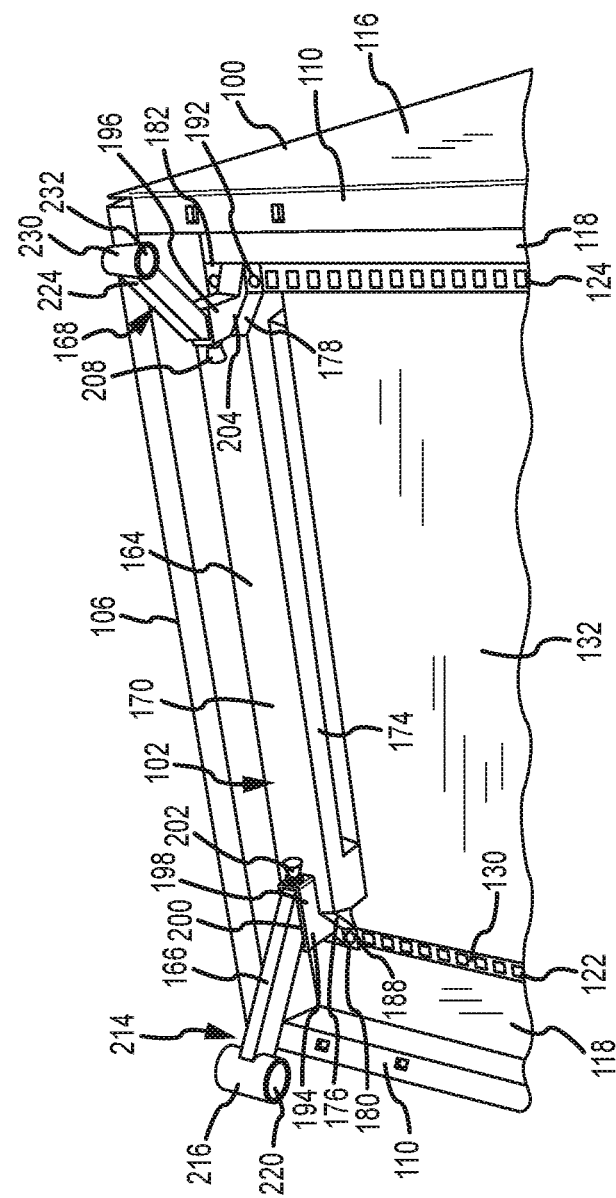
FIG. 3 is a close-up view of a portion of the cabinet depicted in FIG. 1 with the door removed.
Figure 4:
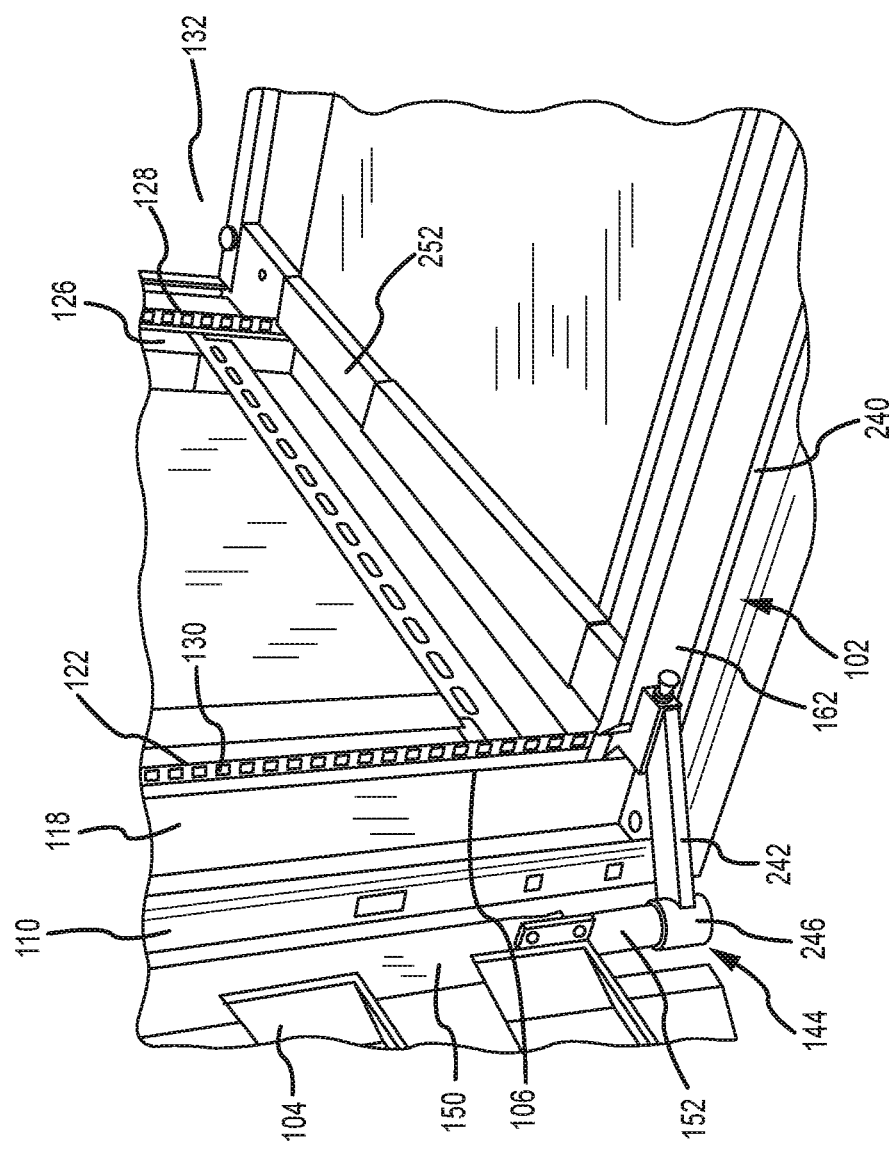
FIG. 4 is a close-up view of a hinge arm of the door mounting system mounted in the cabinet depicted in FIG. 1 with the door removed.

With additional reference to FIGS. 2-4, the rack 106 is generally made up of a front pair of vertically-extending supports 118 and 120, a front pair of ear rails 122 and 124, a rear pair of vertical-extending supports (one support 126 of which is shown in FIG. 4), and a rear pair of ear rails (one ear rail 128 of which is shown in FIG. 4). The vertically-extending supports 118, 120, and 126 are located just inside of the vertical posts 110 of the cabinet 100. In an embodiment, the front pair of ear rails 122 and 124 extends alongside a corresponding one of the front pair of vertically-extending supports 118 and 120. Similarly, each ear rail of the rear pair of ear rails 128 extends alongside a corresponding one of the rear vertically-extending supports 126.

As depicted, each ear rail 122, 124, 128 includes an array of openings 130 that can be used for securing the door 104 and/or computing components to the rack 106. Desirably, the front pair of ear rails 122 and 124, and likewise, the rear pair of ear rails 128, are located a predetermined distance from each other so that corresponding openings 130 on each ear rail of the front pair of ear rails 122 and 124 comply with configuration standards set forth by the EIA. For example, the front ear rails 122 and 124 are set a distance apart so that corresponding openings 130 are about 17.7-inches apart. The openings 130 on the rear pair of ear rails 122 and 124 are desirably located the same predetermined distance apart as well.

The door 104 is coupled to the cabinet 100 over a front opening 132 thereof so that, when closed, the computing components are concealed within the cabinet 100. The door 104 includes an outer frame section 134 surrounding a main body 136. In an embodiment, the outer frame section 134 of the door 104 is configured to extend along the outer edge of the cabinet 100 and surrounds the main body 136. The outer frame section 134 has a width that is substantially equal to or slightly greater than a distance between the vertically-extending supports 118 and 120 and a height that is substantially equal to or slightly greater than a distance between the top wall 112 and bottom platform 114 of the cabinet 100. In another embodiment, the outer frame section 134 has dimensions that match the front of the cabinet 100.

Figure 5:
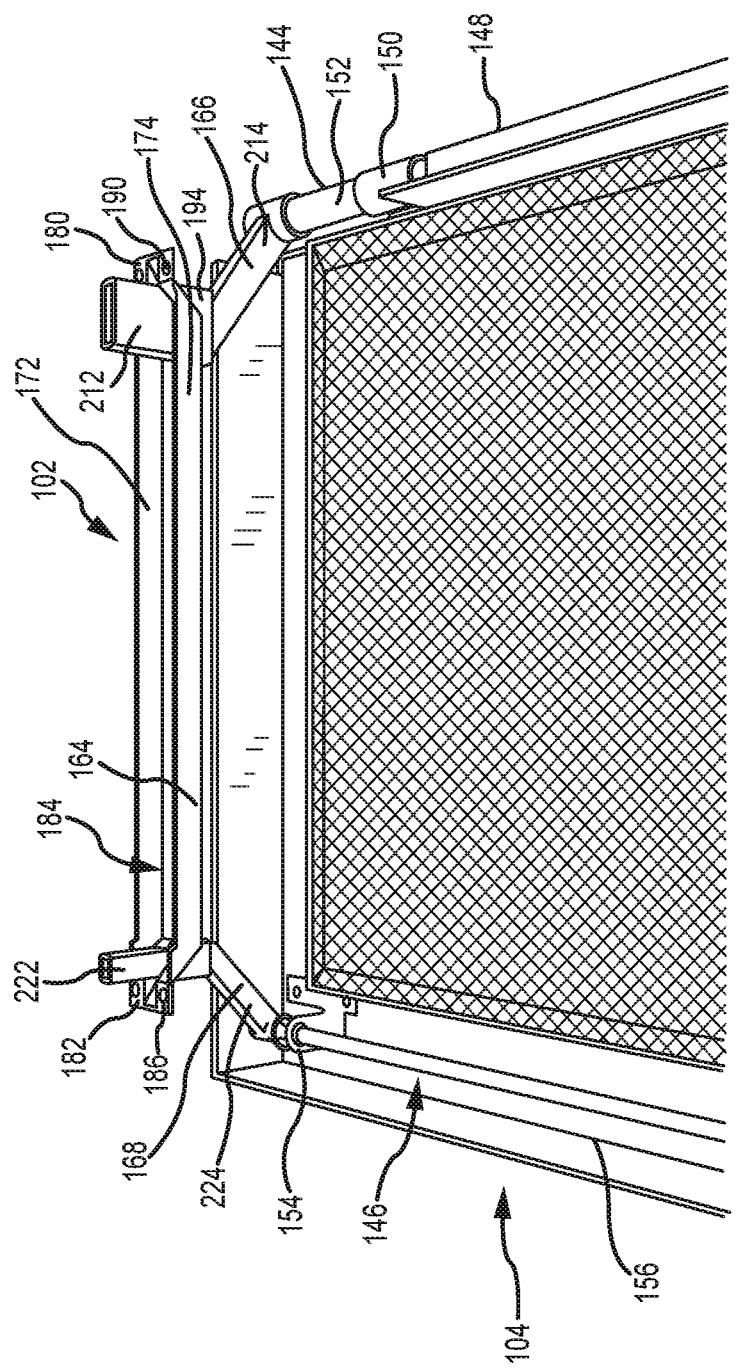
FIG. 5 is a rear, close-up view of the door mounting system and a door mounted thereto.

To improve cooling of the computing components, the main body 136 of the door 104 includes open spaces to allow airflow into the cabinet 100. For example, as illustrated in FIGS. 1 and 2, fixed or adjustable louvers 138 extend between vertical sides of the outer frame section 134. The louvers 138 are sufficiently spaced apart to allow cool air into the cabinet 100, in an embodiment. Alternatively, each louver 138 is tilted at an angle relative to a front edge of the outer frame section 134 forming slits between adjacent louvers 138. The tilt angle of one or more the louvers 138 is adjusted by sliding a front edge of the louvers 138 in a vertical direction, in an embodiment. In another embodiment, a side actuating mechanism (not shown) is used to adjust the tilt angle of one or more of the louvers 138. In another embodiment as shown in FIG. 5, the main body 136 is made up of a rectangular front frame 140 with a mesh or perforated material providing airflow into the cabinet 100. Alternatively, the door 104 partially covers the front opening 132 so that cool air enters the cabinet 100 through an uncovered portion.

With continued reference to FIGS. 1, 4, and 5, the door 104 includes a door attachment component 144 and a latching rod component 146. The door attachment component 144 extends along and is mounted to a vertical edge 148 of the outer frame section 134 and includes a vertically extending pole 150 and door pins 152 inserted into openings formed on both ends of the pole 150. One or both of the door pins 152 includes a spring biased to an expanded position, either disposed on a shaft of the door pin 152 and disposed within the pole 150 or disposed between the end of the pin 152 and a stop (not shown) disposed within the pole 150. The latching rod component 146 extends between top and bottom guide mechanisms 154 that guide the latching rod component 146 along the other vertical edge 156 of the door 104 for receipt by the door mounting system 102. In an embodiment, the latching rod component 146 is coupled to an actuating mechanism (not shown) formed on or attached to the door 104, such as handle (not shown) attached to an exterior face of the door 104, to allow the customer to move the latching rod component 146 vertically between latch and unlatch positions.

As shown in FIGS. 1 and 4, the door mounting system 102 includes a top mount 160 and a bottom mount 162 that are configured to be mirror images of each other. With additional reference to FIGS. 2-5, the top mount 160 is coupled to a top portion of the rack 106, for example at the top-most 1U spaces of the rack 106, and is made up of a mount plate 164, a hinge arm 166, and a latch arm 168. The mount plate 164 has a substantially rectangular front wall 170, top and bottom walls 172 and 174 extending rearwardly from the top and bottom edges of the front wall 170, and angled sidewalls 176 and 178 including first and second end flanges 180 and 182 extending from the sidewalls 176 and 178, respectively.

The walls 170, 172, 174, 176, and 178 form a rear open cavity 184. The first end flange 180 includes mount holes or mount openings 186 configured to align with corresponding openings 130 on the left vertically-extending support 118 and to receive fasteners 188, such as bolts or screws, therethrough for attaching the first end flange 180 to the left vertically-extending support 118. The second end flange 182 attaches to the right vertically-extending support 120 and has mount holes 190 to align with corresponding openings 130 of the support 120 to receive fasteners 192, such as bolts or screws, therethrough.

The top mount 160 also includes a hinge arm support member 194 and a latch arm support member 196 formed thereon. The hinge arm support member 194 has walls 198 extending from the front wall 170 and side wall 176 substantially perpendicularly to the front wall 170 with a top edge defining a top opening 200 for receiving an end of the hinge arm 166. To provide sufficient support to the hinge arm 166 when coupled to the mount plate 164, the top opening 200 has a cross-section configuration that matches and is slightly larger than an outer diameter configuration of the inserted portion of the hinge arm 166 to provide a snug fit therewith. An adjustable spring loaded pin 202 extends through the wall 198 of the hinge arm support member 194 to secure the hinge arm 166 to the hinge arm support member 194. An end of the pin 202 is disposed behind the wall 198. The spring is secured between the end of the pin 202 and a rear surface of the wall 198.

The latch arm support member 196 includes walls 204 extending from the front wall 170 and side wall 178 substantially perpendicularly to the front wall 170 having a top edge defining a top opening 206 into which the latch arm 168 is inserted. The top opening 206 has a cross-sectional configuration that matches and is slightly larger than an outer diameter of the inserted portion of the latch arm 168 to provide a snug fit therewith. An adjustable spring loaded pin 208 operating similarly to pin 202 is included through the wall 204 of the latch arm support member 196.

Figure 6:
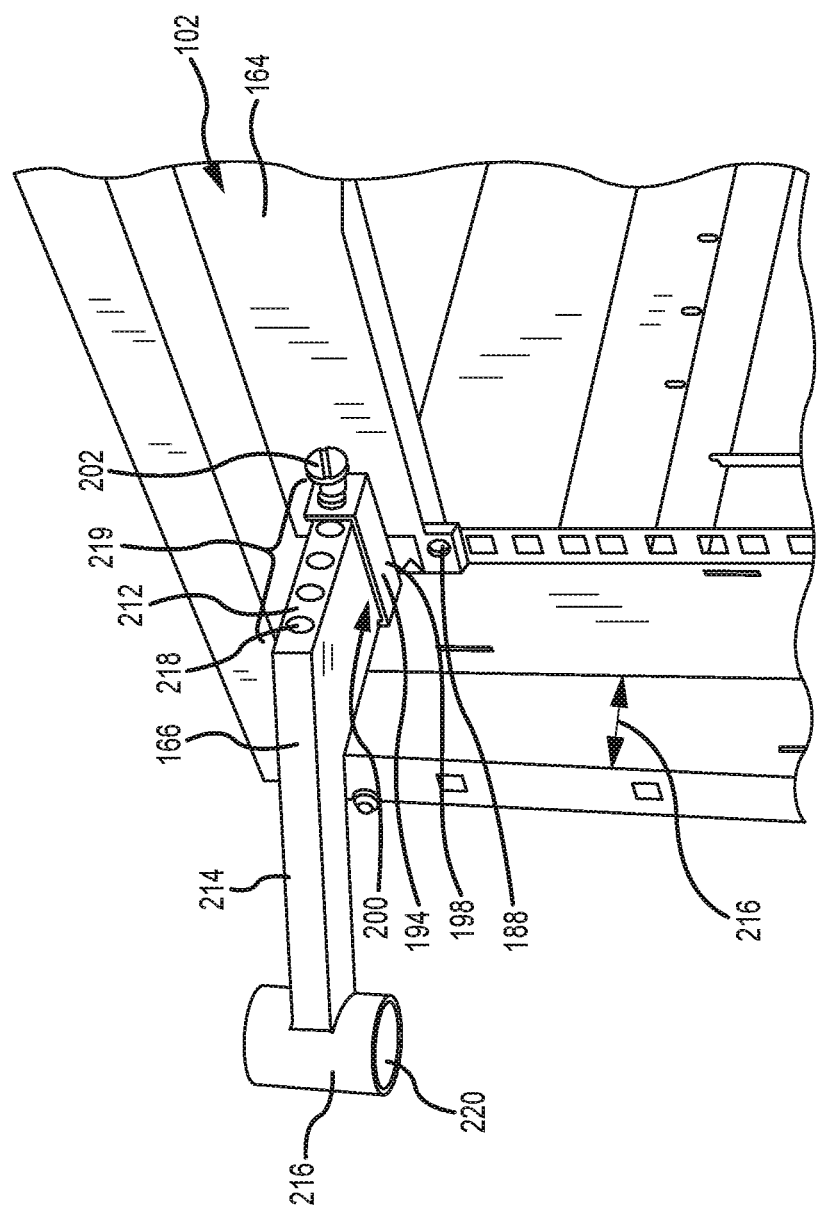
FIG. 6 is a close-up view of a hinge arm of the door mounting system mounted in the cabinet depicted in FIG. 1.

Referring additionally to FIG. 6, the hinge arm 166 is adjustably coupled to the mount plate 164 via the hinge arm support member 194 and hence is located adjacent to the first end flange 180. The hinge arm 166 includes a plate coupling portion or adjustment section 212 and a door support portion or a support section 214 extending therefrom. To compensate for the variability of distances from rack to rack of the front posts 110 of the cabinet 100 to the front supports 118 and 120 (for example, distance 216), the hinge arm 166 is configured to couple to the mount plate 164 such that a distance 219 from a furthest edge of the plate coupling portion 212 to the front wall 170 of the mount plate 164 can be adjusted to a length substantially equal or slightly greater than distance 216. In this regard, the plate coupling portion 212 has a length that is greater than the height of the hinge arm support walls 198 and, in embodiment, thereby extends rearwardly beyond the cavity 184 of the mount plate 164. The plate coupling portion 212 also includes a plurality of apertures 218 configured to align with the location of the pin 202 when the hinge arm 166 is inserted into the hinge arm support member 194. The apertures 218 allow the hinge arm 166 to be adjusted between a plurality of depths within the hinge arm support member 194. When the pin 202 is pulled partially out of one of the openings 218 of the hinge arm support member 194, thereby contracting the spring, the hinge arm 166 can be inserted into (if not already attached to the mount plate 164), inserted further into (if readjustment is desired), or pulled out (if removal is desired) of the cavity 184 of the support member 194. Specifically, after the hinge arm 166 is suitably positioned and the end of the pin 202 is within a desired adjustment aperture 218 on the hinge arm 166, the pin 202 is released to cause the spring to expand to its previously biased configuration to maintain the hinge arm 166 at a desired depth within the hinge arm support member 194.

The door support portion 214 couples to the door 104 and extends at an angle from the plate coupling portion 212 and has a length suitable for allowing the door mount system 102 to retain the door 104 just outside the footprint of the cabinet 100. For example, the angle between the plate coupling portion 212 and door support portion 214 is selected to provide a desired clearance between the door 104 and the cabinet 100 or rack 106 when the door 104 is mounted to the rack 106. In an embodiment, the angle between the two portions 212 and 214 is between about 30 and 60 degrees, and more preferably about 45 degrees.

A free end of the door support portion 214 includes a door pin receptacle 216 that is coupled to, for example, via welding, or formed as part of the free end of the door support portion 214. A bottom opening 220 of the door pin receptacle 216 is sufficiently sized to receive the door pin 152 therein. In another embodiment, the door pin receptacle 216 additionally or alternatively includes a top opening (not shown) for receiving a suitably configured door pin of the door 104.

With reference to FIGS. 1-3, 5, 7, and 8, on an opposite end of the mount plate 164 from the hinge arm 166, the latch arm 168 includes a plate coupling portion 222 and a latch support portion 224. The latch arm 168 couples to the mount plate 164 such that a distance from a furthest edge of the plate coupling portion 222 to the front wall 170 of the mount plate 164 (e.g., distance 226) can be adjusted to a distance substantially equal to or slightly greater than the distance between the front posts 110 to the front support 118 and 120 (i.e., distance 216) allowing the right side of the door 104 to lay substantially flush with the cabinet 100 when completely closed. The plate coupling portion 222 has a length greater than the height of the latch arm support walls 204 allowing the latch arm 168 to extend out the cavity 184. The plate coupling portion 222 has apertures 228 configured to align with the location of the pin 208 on the latch arm support member 196 when the latch arm 168 is inserted into the latch arm support member 196. The apertures 228 provide the latch arm 168 with a plurality of depths for adjustment relative to the latch arm support member 196. Thus, when the pin 208 is pulled partially out of one of the spaced apart apertures 202 of the latch arm support member 196, a spring expanded to a biased position disposed on the spring loaded pin 208 contracts to allow the latch arm 168 to be repositioned within the support member 196. When the latch arm 168 is positioned at a desired location and the end of the pin 208 is placed disposed over a desired aperture 228 on the latch arm 168, the pin 208 is released to cause insertion thereof and expansion of the spring to its previously biased configuration to maintain the latch arm 168 at a desired depth within the latch arm support member 196.

The latch support portion 224 is configured to maintain the door 104 in the closed position and is angled, in an embodiment, toward a direction of a corresponding portion of the latching rod component 146 on the door 104 when the door 104 is closed. In an embodiment, the angle at which the latch support portion 224 extends relative to the plate coupling portion 222 is, for example, between about 30 and 60 degrees, and more preferably about 45 degrees. In another embodiment, the latch support portion 224 extends linearly from the plate coupling portion 222. A free end of the latch support portion 224 includes a downward-facing latch pin receptacle 230 that is coupled to, for example, via welding, or formed as part of the free end of the latch support portion 224. A bottom opening 232 of the latch pin receptacle 230 is sufficiently sized to receive the latching rod component 146 therein.

With reference to FIG. 4, the bottom mount 162 of the door mounting system 102 is coupled to a bottom portion of rack 104, for example, the bottom-most 1U of the rack 106. The bottom mount 162 is configured substantially similarly to the top mount 160 and has a mount plate 240, a hinge arm 242, and a latch arm (not shown), except that a door pin receptacle 246 on the hinge arm 242 includes a top opening 248 to receive a bottom door pin 150 therein and a latch pin receptacle (not shown) on the latch arm is upward-facing.

To provide additional structural security when a heavy door is mounted to the cabinet 100, the bottom mount 162 includes a stiffener rail 252. The stiffener rail 252 is formed from steel or another suitable material and in an embodiment, extends from a rear of the mount plate 240 toward a rear vertically-extending support 122 of the rack 106. The stiffener rail 252 telescopes in length and thus, can be adjusted to accommodate a variety of distances between front and rear supports 118, 120, and 122. Fasteners (not shown) are used to mount the free end of the stiffener rail 252 to the rack 106. Although illustrated as being included on the bottom mount 162, the stiffener rail 252 additionally or alternatively is included on the top mount 160 in other embodiments.

Figure 9:
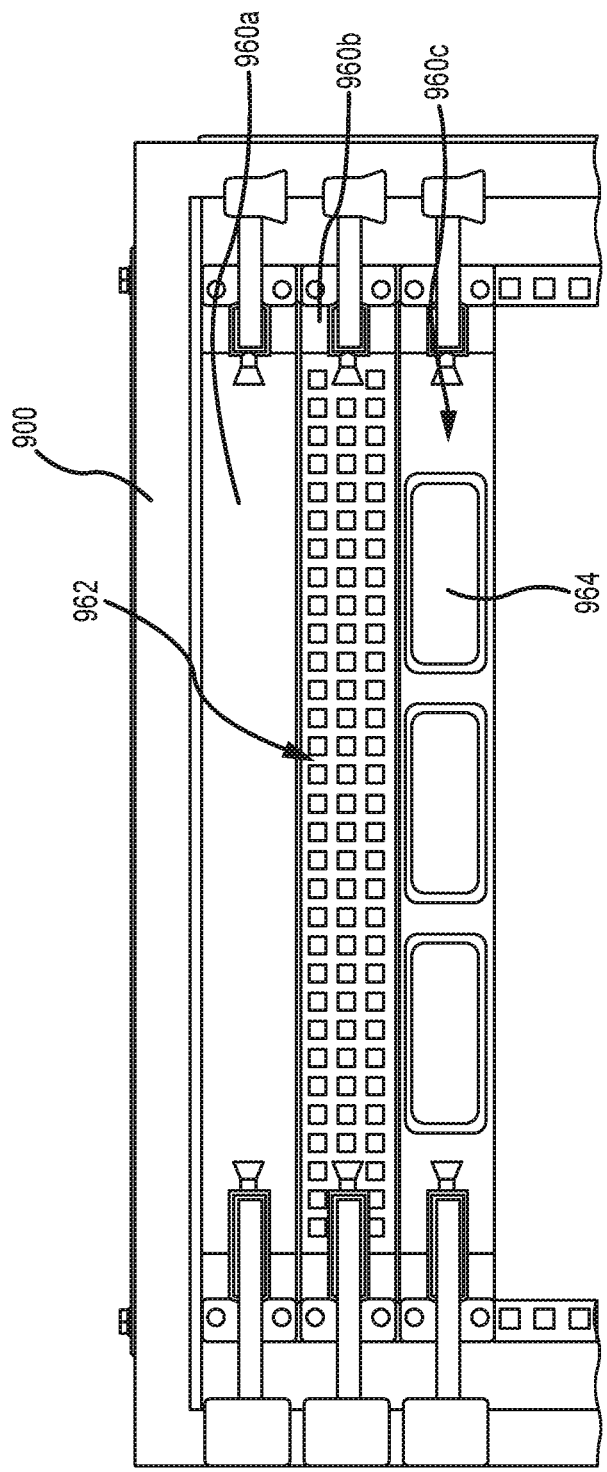
FIG. 9 is a front view of a portion of a cabinet including three plate configurations of the mount.

Portions of the door mounting system 102 can be customized to include additional storage or cooling features. For example, as illustrated in FIG. 9, mount plates 960a, 960b, 960c can be configured for different purposes. In an embodiment, a mount plate 960a is configured as a solid piece of material and is suitable for concealing wires and cables. In another example, a mount plate 960b includes an array of cooling holes 962 to improve cool air circulation through the cabinet 900 during computer component use. Although three rows of substantially identically configured holes are included, more or fewer holes or smaller or larger holes are used in alternate embodiments. According to another example, a mount plate 960c includes three large openings 964 through which cables are fed.

Alternatively, the door mounting system 102 is customized to accommodate a variety of different door features. In an embodiment as shown in FIG. 10, an asymmetric door mounting system 1002 is attached to a rack 1006 and provides additional structure for supporting a wider door (for example, door having a width that extends from just flush with a vertical edge of a cabinet 1000 to an opposite vertical edge just inside the cabinet 1000). In an example, door system 1002 includes a hinge arm 1066 that is slightly longer than the latch arm 1068. To provide further support, a door pin receptacle 1046 is configured to receive a suitably configured door pin 1052, and the door pin receptacle 1046 may be larger than a latch pin receptacle 1030.

In another embodiment shown in FIG. 11, a symmetric door mounting system 1102 is attached to a rack 1106. The symmetric configuration allows the door mounting system 1102 to be mounted either to the top or bottom of the rack 1106. More specifically, the door mounting system 1102 is positioned such that a door pin receptacle 1146 on a hinge arm 1166 has an opening 1148 facing downwards, and a latch pin receptacle 1130 on a latch arm 1168 has an opening also facing downwards. To mount the system 1102 on a bottom of the rack 1106, the system 1102 can be repositioned or another system 1102 can be mounted wherein the latch arm 1168 includes the opening 1148 facing upwards to serve as the door pin receptacle, and the hinge arm 1166 has an opening that also faces upwards to serve as a latch pin receptacle.

In still another embodiment, the doors may be provided in a split door configuration as depicted in FIG. 12. In this regard, both ends of a door mounting system 1202 include hinge arms 1266a and 1266b extending in opposite directions with door pin receptacles 1246a and 1246b at the ends of the hinge arms 1266a and 1266b. A latch pin receptacle 1230 extends from a latch arm 1268 that disposed substantially in between the hinge arms 1266a and 1266b. The latch pin receptacle 1230 is configured to receive latching rods of both doors (not shown).

Figure 13:
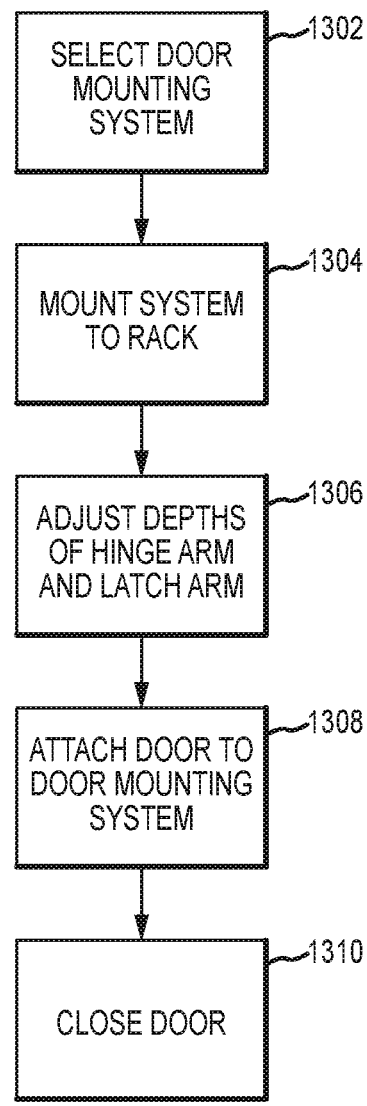
FIG. 13 is a flow diagram of a method of installing a door mounting system to a rack.

FIG. 13 is a flow diagram of a method 1300 of mounting a door to a rack, according to an embodiment. An installer initially selects a door mounting system at 1302. Selection is based on door configuration, such as split door or single door and/or width and/or weight of the door. For example, one of the door mounting system illustrated in FIGS. 10-12 is selected. The door mounting system is then mounted to a rack 106 at 1304. In an embodiment, the installer begins with a bottom mount 162 and aligns the mount holes of the bottom mount 162 with corresponding openings 130 on the front vertically-extending supports 118 and 120 of the rack 106. The bottom mount 162 is then attached to the rack 106 via fasteners (not shown), such as screws, bolts, or other suitable coupling mechanism. In an embodiment in which the bottom mount 162 includes a stiffener rail 252, the installer adjusts a length of the rail 252 and secures the free end of the rail 252 to the rear support 122. Next, with reference to FIG. 3 the installer installs a top mount 160 to the rack 106 by aligning mount holes 186 of the top mount to corresponding openings 130 on a top portion of the vertically-extending support 118 and 120 of the rack 106. The top mount 160 is attached to the rack 106 via fasteners. It will be appreciated that in other embodiments, the top mount 160 is installed prior to installation of the bottom mount 162 and/or one of the mounts 160 or 162 is omitted from installation.

The hinge arms 166 and 242 and latch arms 168 and 244 of the top and bottom mounts 160 and 162 are manually adjusted to suitable depths relative to the rack 106 at 1306. For ease of explanation, a description will be provided in the context of the top mount 160 and it will be understood that the bottom mount 162 components are substantially similarly adjusted. With reference to FIG. 6, the spring-loaded pin 202 is pulled out to allow the hinge arm 166 to be repositioned relative to the mount plate 164 such that distance 226 is equal to distance 216. Once properly positioned, the spring-loaded pin 202 is released to secure the hinge arm 166 at the desired locations. Similarly, as shown in FIG. 7, the spring loaded pin 208 of the latch arm 168 is adjusted as well.

After the door mounting system 102 is suitably mounted to the rack 106, the door 104 (or doors, in a split door configuration) is attached at 1308. Specifically, with reference to FIGS. 2, 4, 5, and 8, the door pins 152 are inserted into the top and bottom door pin receptacles 216 and 246 on the mounts 160 and 162. The top door pin 152 is positioned within the top door pin receptacle 216, and the installer pulls the bottom door pin 152 vertically upward to compress the spring within the pole 150. The pole 150 is aligned such that the bottom door pin 152 is positioned over the bottom door pin receptacle 246. The pin 152 is then released and the spring expands to cause the pin 152 to be retained in the door pin receptacle 246. In another embodiment, the bottom door pin 152 is inserted into the bottom door pin receptacle 246 prior to insertion of the top door pin 152 into the top door pin receptacle 216. In still another embodiment, the spring is located on the top door pin 152, which is pulled vertically downward. In an embodiment in which split doors are used and the mounts 160 and 162 include opposite extending hinge arms (e.g., hinge arms 1266a and 1266b) each having top and bottom door pin receptacles 216 and 246, both doors are attached to the mounts 160 and 162 in a substantially similar fashion as previously described.

After mounting, the door(s) 104 are closed at 1310. Specifically, the installer closes the door(s) and actuates the actuating mechanism (not shown) causing the latching rod component 146 to adjust vertically and to be repositioned within the latch pin receptacles 230 and 250.

The above-described door mounting system 100 is a versatile component that can be used universally on any rack or cabinet that is based on EIA standards and spacing. The system 100 can be used to transfer a door having a manufacturer-provided feature from a manufacturer-provided shipping rack to a customer site rack. For example, the manufacturer-provided door may have a heat exchange mechanism, such as the louvers described above, a higher percentage of open space, sealing for electromagnetic interference containment, or other features, which then can be installed on the customer's own rack.

Although at least one embodiment has been described above, it should be appreciated that such embodiments are only examples, and are not intended to limit the scope, applicability, or configuration of the invention in any way. A vast number of variations exist and it should be understood that various changes may be made in the function and arrangement of elements described in an exemplary embodiment without departing from the scope of the invention as set forth in the appended claims.

What is claimed is:

1. A door mounting system comprising:
  a rack including a first pair of vertically-extending supports, each support including an array of openings;
  a first mount coupled to the rack at a first position thereon, the first mount including:
    a first plate extending between the first pair of vertically-extending supports and including a first end and a second end, each of the first end and the second end including fastener openings aligned with corresponding openings of the array of openings of a corresponding support of the first pair of vertically-extending supports; and
    a first hinge arm adjustably coupled with the first plate and extending at an angle from a first side of the plate adjacent to the first end, the first hinge arm including a first door pin receptacle to receive a first door pin therethrough for coupling the door to the rack via the first plate; and
  a second mount coupled to the rack at a second position located below the first position, the second mount including:
    a second plate extending between the first pair of vertically-extending supports and including a first end and a second end, each of the first end and the second end including fastener openings aligned with corresponding openings of the array of openings of a corresponding support of the first pair of vertically-extending supports; and
    a second hinge arm adjustably coupled with the second plate and extending at an angle from the first side of the second plate adjacent to the first end thereof, the second hinge arm including a second door pin receptacle to receive a second door pin therethrough for coupling the door to the rack via the second plate;
  wherein:
    the first plate includes a hinge arm support member disposed over the first side of the first plate,
    the hinge arm support member includes a top opening to receive an end of the first hinge arm opposite the door pin receptacle,
    a spring loaded pin extends through a wall of the hinge arm support member, and
    the end of first hinge arm includes an array of apertures each configured to receive an end of the spring loaded pin to maintain the first hinge arm at a desired depth within the hinge arm support member selected from a plurality of depths for the end of the first hinge arm.

2. The door mounting system of claim 1, wherein:
  the first hinge arm includes an adjustment section and a support section,
  the adjustment section is configured to extend substantially perpendicularly from the first plate, and
  the support section extends from the adjustment section at an angle away from the first end of the first plate to provide a clearance between the door and the rack when the door is coupled thereto via the first mount.

3. The door mounting system of claim 1, further comprising a third hinge arm adjustably coupled with the first plate and extending at an angle from the first side of the first plate adjacent to the second end, the third hinge arm including a door pin receptacle to receive a door pin therethrough for coupling an additional door to the rack via the first plate.

4. The door mounting system of claim 1, further comprising a latch arm adjustably coupled with the first plate and extending at an angle from the first side of the first plate adjacent to the second end, the latch arm including a latch receptacle to engage with a latch coupled to the door.

5. The door mounting system of claim 4, wherein:
  the first plate includes a latch arm support member disposed over the first side of the first plate,
  the latch arm support member includes a top opening to receive an end of the latch arm opposite the latch receptacle,
  a spring loaded pin extends through a wall of the latch arm support member, and
  the end of latch arm includes an array of apertures each configured to receive an end of the spring loaded pin to maintain the latch arm at a desired depth within the latch arm support member selected from a plurality of depths for the end of the latch arm.

6. The door mounting system of claim 1, further comprising a latch arm adjustably coupled with the first plate extending from a middle portion thereof, the latch arm including a latch receptacle to engage with a latch coupled to the door.

7. The door mounting system of claim 1, wherein:
  the rack includes an additional vertically-extending support spaced apart from the first pair of vertically-extending supports, and
  the first plate includes an adjustable stiffener rail including a first end coupled thereto, the stiffener rail extending away from a second side of the first plate and having a second end coupled to the additional vertically-extending support.

* * * * *